United States Patent [19]
McMillan et al.

[11] Patent Number: 5,138,520
[45] Date of Patent: Aug. 11, 1992

[54] METHODS AND APPARATUS FOR MATERIAL DEPOSITION

[75] Inventors: Larry D. McMillan; Carlos A. Paz de Araujo, both of Colorado Springs, Colo.

[73] Assignee: Symetrix Corporation, Colorado Springs, Colo.

[21] Appl. No.: 690,940

[22] PCT Filed: Dec. 27, 1989

[86] PCT No.: PCT/US89/05882
§ 371 Date: Jun. 17, 1991
§ 102(e) Date: Jun. 17, 1991

[87] PCT Pub. No.: WO90/07390
PCT Pub. Date: Jul. 12, 1990

Related U.S. Application Data

[63] Continuation-in-part of Ser. No. 290,468, Dec. 27, 1988.

[51] Int. Cl.$^5$ .......................... H01G 4/06; B05D 3/06
[52] U.S. Cl. ................................. 361/311; 427/54.1
[58] Field of Search ........................... 361/311-313; 427/54.1, 35, 109, 101, 126.3; 118/50.1

[56] References Cited

U.S. PATENT DOCUMENTS

| | | | |
|---|---|---|---|
| 4,569,855 | 2/1986 | Matsuda et al. | 427/35 |
| 4,571,350 | 2/1986 | Parker et al. | 427/109 |
| 4,585,671 | 4/1986 | Kitagawa et al. | 427/54.1 |
| 4,683,147 | 7/1987 | Eguchi et al. | 427/54.1 |
| 4,792,463 | 12/1988 | Okada et al. | 427/126.3 |
| 4,811,684 | 3/1989 | Tashiro et al. | 118/50.1 |
| 4,888,305 | 12/1989 | Yamazaki et al. | 437/101 |

FOREIGN PATENT DOCUMENTS

| | | |
|---|---|---|
| 233610 | 8/1987 | European Pat. Off. |
| 128264 | 9/1985 | Japan |
| 198718 | 10/1985 | Japan |
| 96327 | 5/1987 | Japan |
| 246826 | 10/1987 | Japan |
| 116768 | 5/1988 | Japan |

OTHER PUBLICATIONS

Applied Physics Letter, Oct. 1988 vol. 53 No. 18 pp. 1702-1704.
Japanese Journal of Applied Physics vol. 27 No. 11 Nov. 1988 pp. L2174-L2176.

*Primary Examiner*—D. Griffin
*Attorney, Agent, or Firm*—Irving M. Weiner; Joseph P. Carrier; Robert M. Petrik

[57] ABSTRACT

Methods and apparatus for depositing thin films of complex (compound) materials, including ferroelectrics, superconductors, and materials with high dielectric constants by photo/plasma-enhanced chemical vapor deposition from stabilized compound sources. Multiple heating and/or spectral energy sources are used for applying high energy, rapid thermal pulses in a precise timed sequence. Sol-gels of compound sources are ultrasonically atomized before being introduced to the deposition chamber.

23 Claims, 4 Drawing Sheets

METHODS AND APPARATUS FOR MATERIAL DEPOSITION

This application is a continuation-in-part of U.S. patent application Ser. No. 290,468 filed Dec. 27, 1988.

TECHNICAL FIELD

The invention relates to methods for depositing high quality films of complex (compound) materials on substrates at high deposition rates, and apparatus for effecting such methods. Particularly, the invention relates to photo/plasma-enhanced, rapidly thermally pulsed metallorganic chemical vapor deposition from stabilized compound sources depositing high quality, stoichiometrically-correct, thin films of a large variety of complex compounds at high deposition rates, and computer controlled apparatus for effecting such methods.

BACKGROUND ART

There are known methods for depositing thin films of complex compounds such as metal oxides, ferroelectrics, super-conductors, materials with high dielectric constants, gems, etc. Such known methods include RF sputtering, chemical vapor deposition (CVD), and spin coating.

DISCLOSURE OF INVENTION

A first embodiment provides a method and apparatus for depositing a thin film on a substrate, comprising the steps of: providing a substrate in an enclosed deposition chamber; introducing at least one vaporized compound source into the chamber at a controlled flow rate; and controlling first means to apply a spectral energy bath to the source within the chamber in a controlled manner to dissociate at least one component from the source and to permit the component to be deposited on the substrate. The bath is tuned to provide optimal energy for dissociating the component from the vaporized source.

A second embodiment provides a method and apparatus for depositing a stoichiometrically-correct thin film on a substrate, comprising the steps of: providing a substrate in an enclosed deposition chamber; introducing at least one substantially stoichiometrically-correct vaporized compound source into the chamber; applying a radio frequency bias in the chamber; applying a direct current bias in the chamber; applying a spectral energy bath to the source within the chamber in a controlled manner to dissociate at least one component from the source and to permit the component to be deposited on the substrate in a stoichiometrically-correct manner; and tuning the bath to provide an optimum energy for dissociating the component from the source.

The invention uses the first and/or second embodiments to produce thin film from stabilized compound sources including, but not limited to, ceramics, glasseous materials, electrically-active materials, and/or ferroelectric materials, such as stabilized sol-gel or MOD (metallorganic decomposition) formulations having a general composition of $ABO_3$, including $PbTiO_3$, $Pb_xZr_yTiO_3$, $Pb_xLa_yZr_sTiO_3$, $YMnO_3$ where Y represents any rare-earth element, and $TiYMnO_3$.

MODES FOR CARRYING OUT THE INVENTION

Figure 1:
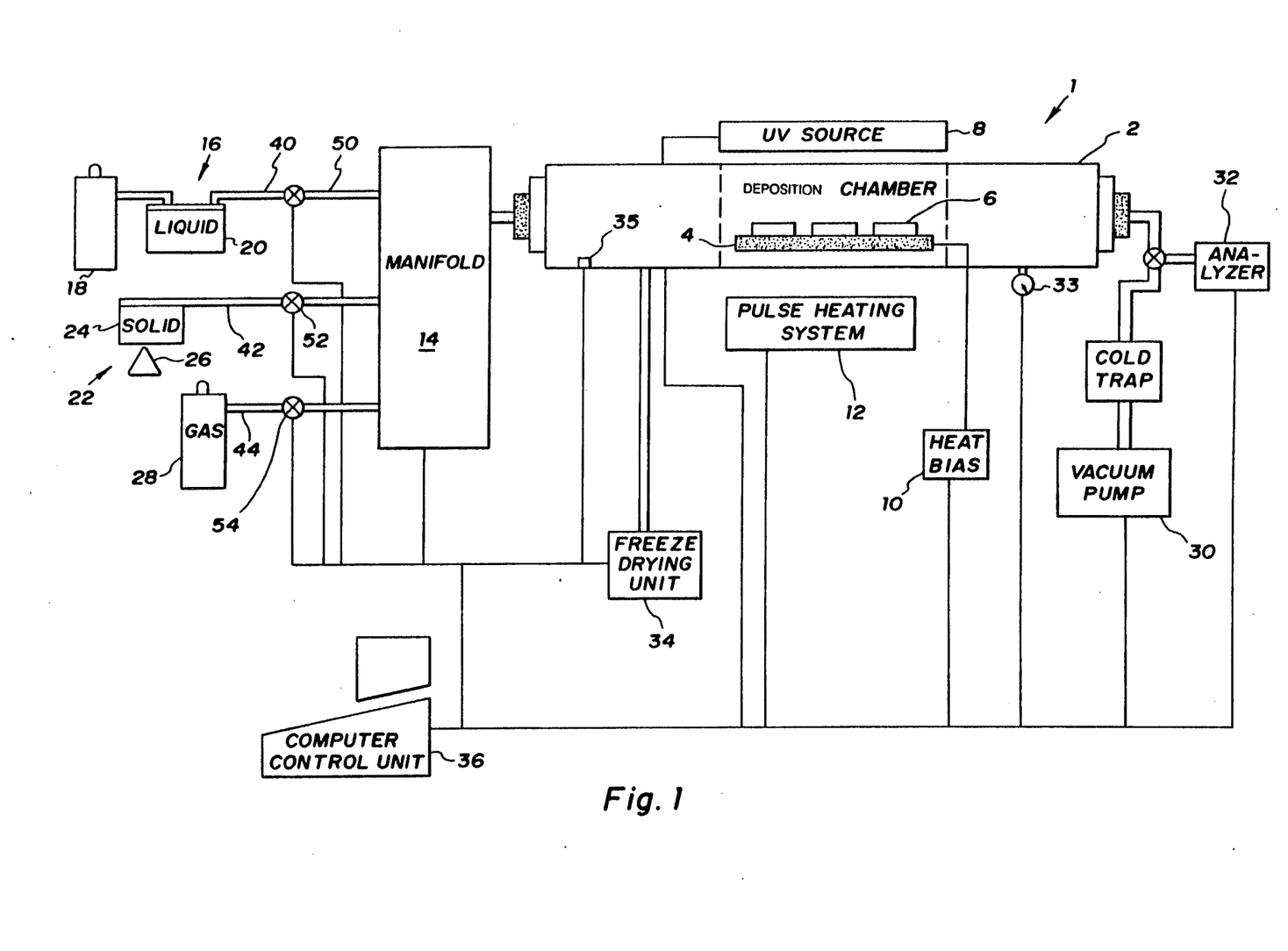
FIG. 1 is a schematic view of a CVD apparatus according to a first embodiment.

FIG. 1 shows a first embodiment of a low pressure CVD apparatus 1 according to the invention. Apparatus 1 includes a deposition chamber 2, a substrate holder 4 which supports one or more substrates 6, a vaporized source manifold 14 for introducing a vaporized source(s) into chamber 2, first, second and third means 8, 10, 12 for applying spectral energy and/or heat to chamber 2, liquid, solid and gaseous feed units 16, 22, 28 for introducing vaporized compound sources into manifold 14, a vacuum pump 30 cooperating with chamber 2, an analyzer 32 for analyzing the composition of gases exhausted from chamber 2, a cooling unit 34 for cooling chamber 2, pressure and temperature sensors 33, 35, and a computer control unit 36 to precisely control apparatus 1.

Units 16, 22, 28 generate and feed a vaporized source of at least one compound into manifold 14, which in turn feeds the vaporized source into chamber 2. Unit 16 includes at least one liquid source container 20 and at least one carrier gas source 18 which is passes through the liquid source in, container 20 to become saturated with the liquid source(s) and then fed into manifold 14 through tube 40. The carrier gas(ses) may be inert or active or may contain a catalyst to increase the deposition rate.

Unit 22 includes at least one container 24 for containing at least one solid source, and means 26 which heats container 24 to vaporize the solid source, the vapors of which are then fed into manifold 14 through tube 42.

Unit 28 feeds at least one gaseous compound into manifold 14 through pipe 44.

Flow control valves 50, 52, 54 on the connector pipes 40, 42, 44, respectively, are controlled by unit 36 to precisely monitor and limit the flow rate of the vaporized sources into manifold 14 and chamber 2.

Not all of units 16, 22, 28 will be used in every operation of apparatus 1, but rather one or more units 16, 22, 28 will be used to deposit a given thin film. More than one of each of units 16, 22, 28 can be used to feed a vaporized source into manifold 14 for any given thin film deposition.

Changes in the composition of a thin film being deposited within chamber 2 are readily achieved by introducing different vaporized sources from units 16, 22, 28 through manifold 14 into chamber 2 in an automatic, computer-controlled manner. Such changes are advantageous. For example, the surface of the thin film can be tailored to achieve ohmic contacts and to reduce depolarization due to Schottky effects.

Although the use of stabilized sources is a preferred aspect, the invention is not so limited. Rather, other aspects, including the spectral energy and heating aspects discussed below, can be used in relation to vaporized sources which do react in chamber 2 before they are deposited on substrate 6. The liquid, solid and gaseous materials introduced by units 16, 22, 28 may be tuned for doping, for stoichiometric modifications, and for formation of other materials after they are vaporized and introduced into chamber 2.

Means 8, 10, 12 are preferably operated in combination in a predetermined manner by unit 36 to achieve a very high (precise) degree of control of the deposition of thin films. In general, means 8, 10, 12 are controlled such that the temperature within chamber 2 will gradually increase during the course of deposition.

Means 8 includes one or more units spaced about chamber 2, and is preferably a light source for applying a spectral energy bath to chamber 2 which "heats" the vaporized source within chamber 2 for dissociating a desired component(s) from the vaporized source to permit the component(s) to be deposited on substrate 6. According to another preferred aspect, the bath applied by means 8 is tuned to optimize/maximize the dissociation of the desired component(s) from the vaporized source. Heat waves/radiant enerty provided by means 8 will be controlled in a predetermined manner to correspond to the energy needed to dissociate or crack the bonds holding the desired component(s) to the metallorganic precursor of solvent in the vaporized source. Sources which could be used as means 8 are ultraviolet (UV) lamps and excimer lasers.

If a ferroelectric thin film of $PbTiO_3$ is being deposited from a vaporized sol-gel source, it is preferable to use a Danielson-type UV light source device controlled to emit UV light rays having a wavelength of approximately 180-260 nanmometers. UV light rays in this wavelength range are particularly effective in resonating and dissociating the hydroxyl bonds hold the $PbTiO_3$ clusters (networks or chains) within the precursor or common solvent in the vaporized source.

Means 8 can be controlled in a pulsed manner, a constant manner and/or ramped manner, or a combination of the foregoing to form a composite control signal. If a UV is used as means 8, it is preferable to operate the source in a pulsed manner to reduce the amount of ozone generated by the spectral bath within chamber 2 (many of the complex thin films which may be deposited contain oxygen).

Means 10 can be a resistive heat bias type heater controlled by unit 36 to generate a high ambient temperature within chamber 2 and/or to heat substrate 6.

Means 10 is preferably operated to create an ambient temperature within chamber 2 which is not sufficient in and of itself to dissociate the desired component(s) from the vaporized compound source and deposit these component(s). Means 10 is preferably operated to create an ambient temperature within chamber 2 which, when combined with the tuned spectral bath provided by means 8 and the timed heat pulses of the third means 12, will dissociate the desired component(s) from the vaporized source in an optimized, precisely controlled manner, without detrimentally affecting the deposited thin film of the underling substrates 6.

In controlling the means 8, 10, 12, two opposing considerations have to be weighed. On the one hand, higher quality of the deposited complex thin films can be achieved at lower ambient temperatures, but on the other hand higher production rates can be achieved at higher ambient temperatures. Although a generally high throughput or production rate is achieved according to the invention in comparison to conventional techniques, it is possible to achieve even greater throughput by increasing the ambient temperature within chamber 2.

Means 12 includes one or more units spaced about chamber 2, and is controlled by unit 36 to apply heat energy heating pulses to the vaporized source within chamber 2 in a carefully timed/synchronized manner corresponding to a plurality of factors, including input flow rate of the vaporized source into chamber 2, desired thin film layer thickness, and (if necessary) the energy requirements needed to activate the thin film being deposited. With many complex thin films, such as ferroelectrics, it is necessary to achieve the ferroelectric phase crystal structure of the film before the film will function in a desired manner.

Means 12 is controlled by unit 36 to rapidly thermally stress chamber 2 with carefully timed high energy heating pulses and/or ramps during the course of deposition. The rapid thermal stressing of chamber 2 is calculated and controlled: so that at every instant the film is at the right activation temperature for deposition, whereby the polar lattice of the film being deposited is being properly, dynamically activated; to continue dissociation of the desired component(s) from the vaporized compound source while preventing the formation of large grains and secondary phases in the deposited film; and to maintain the temperature of the deposited film within acceptable limits of the particular substrate 6 onto which the film is being deposited, which maybe an integrated circuit (IC). Acceptable limits of IC processing are a function of the particular IC step at which the film is being deposited. The temperature cannot be so high as to damage the underlying substrate or IC onto which the film is being deposited.

Means 12 preferably includes one or more halogen lamps, water cooled arc lamps and/or microwave sources and/or resistive heaters that can be pulsed, placed about chamber 2 and aimed to direct high energy pulses towards a film being deposited.

If means 8 is pulsed, such pulsing may (but not necessarily) correspond to the time sequence of the high energy heating pulses applied by means 12.

Means 12 is an important aspect in that it is controllable with a high degree of precision to quickly provide large amounts of energy when it is needed and where it is needed. By controlling means 12 it is possible to precisely control: the rate of chemical dissociations within chamber 2; the layer by layer thickness of the film being deposited and the activation of the film being deposited.

If a ferroelectric thin film of $PbTiO_3$ is being deposited, means 8 is tuned to maximize dissociation of the hydroxyl bonds, and means 12 is actuated in short cycles, such as 3-10 seconds, and/or longer ramps to rapidly thermal stress chamber 2 to permit the $PbTiO_3$ to be properly deposited and activated over substrate 6 in a very uniform, layer by layer manner.

An important parameter of many complex thin films, such as ferroelectrics, is that they are generally required to be quite thin (for example, within a range of 100-5000 Å) and such film thicknesses can be readily achieved according to the invention. The invention can be used to generate much thicker films, if desired.

The methods and apparatus according to the invention are controlled such that the temperature within chamber 2 progressively increases over the course of a film's deposition. Preferably, such temperature increase will be precisely controlled in a stepped manner and unit 36 will be programmed with information pertaining to the temperature of the deposition process at each step thereof, $T_{si}T$ (si=time interval of the ith step), and the temperature rising rate $\pi$ within chamber 2.

A second (optional) use of means 12 is in-situ annealing of a deposited film within chamber 2 as a final processing step. After the proper film thickness has been deposited, means 12 may be controlled to apply high temperature pulses (e.g. 700° C.-950° C.) to the film for an appropriate time period. Such appropriate time period can be as little as 3 seconds and should not exceed 2 minutes. This rapid, in-situ, thermal annealing technique is advantageous because it eliminates the loss of certain critical elements (such as lead) which undesirably occurs during conventional, high temperature annealing processes.

A freeze drying unit 34 (or cold bed) can be used for lowering the temperature of chamber 2. Unit 34 is controlled by unit 36 according to predetermined parameters.

The invention also includes a vacuum pump 30 because thin film depositions will be carried out at pressures in the range of $10^{-3}$ torr through $10^{-6}$ torr.

Figure 2:
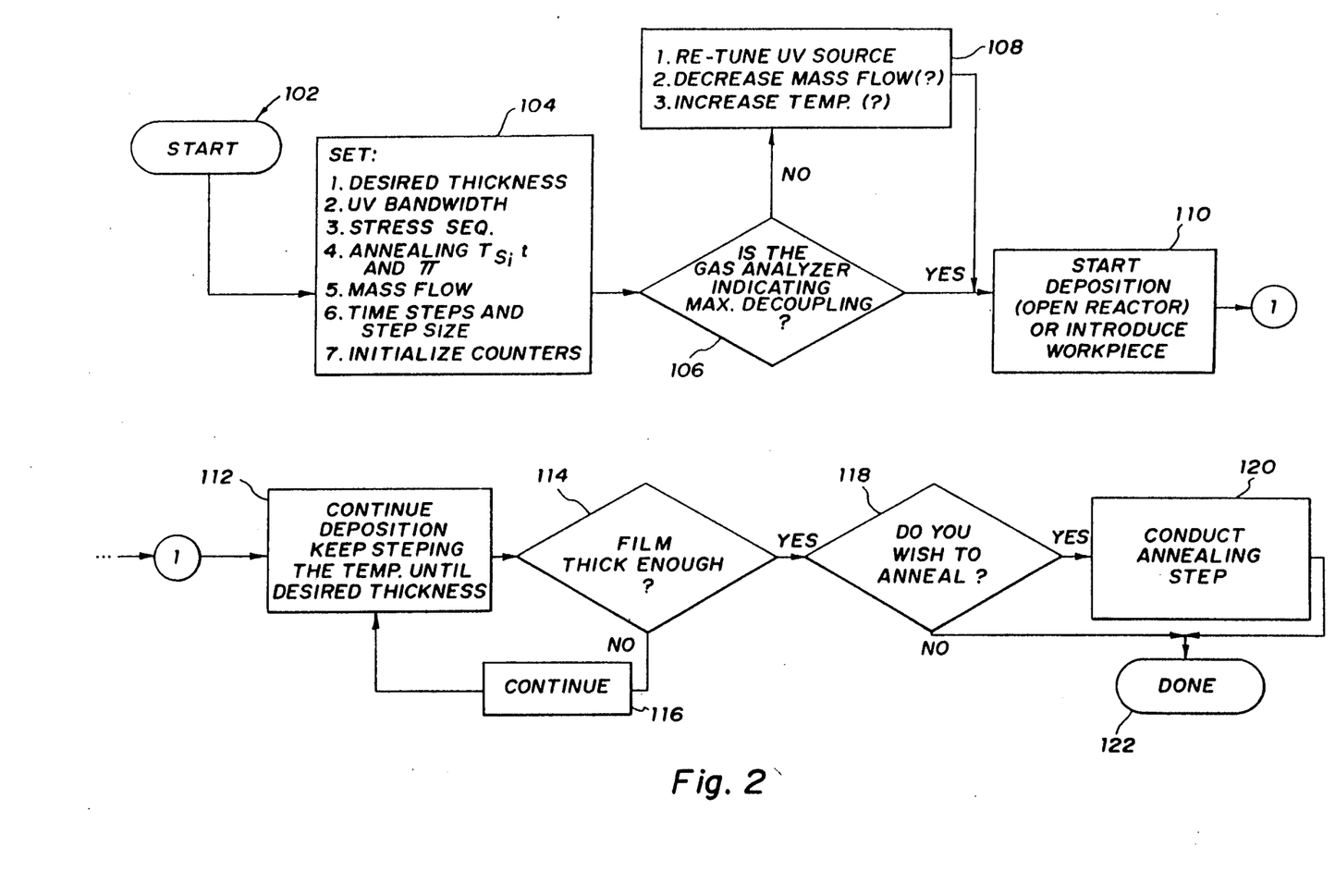
FIG. 2 is a flow chart of the first embodiment.

FIG. 2 shows a flow chart of a computer controlled deposition process according to the invention. At first stage 102 the computer process is started or initialized. At stage 104, the desired parameters of the film to be deposited are programmed into the computer including, desired film thickness, UV bandwidth of means 8, thermal stress sequencing by means 10, activation requirements of the film, mass flow of the vaporized source from units 16, 22, 28 into manifold 14 and from manifold 14 into chamber 2, the number of timed steps and step size for the deposition process, and an initialization of a counter. The activation requirements of the film are primarily functions of: (1) the temperature of the deposition process at each step $T_{s/t}$; and (2) the temperature rising rate $\pi$ within the chamber.

At stage 106, the unit 36 determines, on the basis of the signal from the analyzer 32, whether maximum dissociation of the desired component(s) is occurring within chamber 2. If maximum dissociation is not occurring, unit 36 will adjust one or more process parameters (including returning of means 8, adjusting mass flow, and adjusting means 12 to change the ambient temperature within chamber 2) at stage 108. At stage 110, unit 36 initializes film deposition, such as by introducing substrates 6. At stage 112, unit 36 continues the deposition process, including progressively increasing the temperature within chamber 2. At stage 114, film thickness is monitored. If the desired film thickness has not been achieved, the deposition is continued through stages 116 and 112. Once the desired film thickness is achieved, a determination is made, at stage 118, as to whether or not the film is to be annealed in-situ. If the annealing step is desired, it is conducted at stage 120. After the annealing step is completed, or if annealing is not desired, the process is stopped at stage 122.

Figure 3:
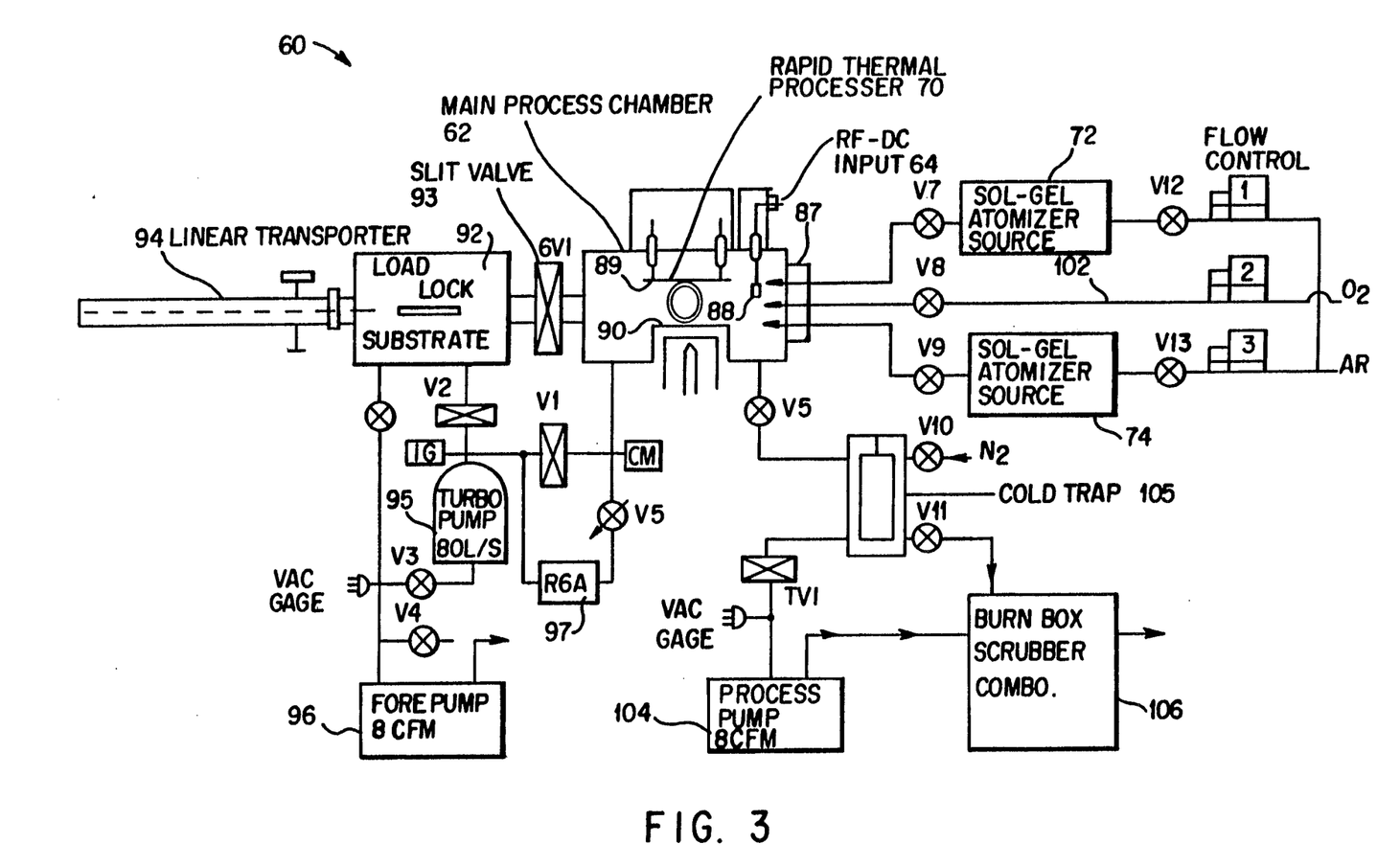
FIG. 3 is a schematic of a second embodiment.
Figure 4:
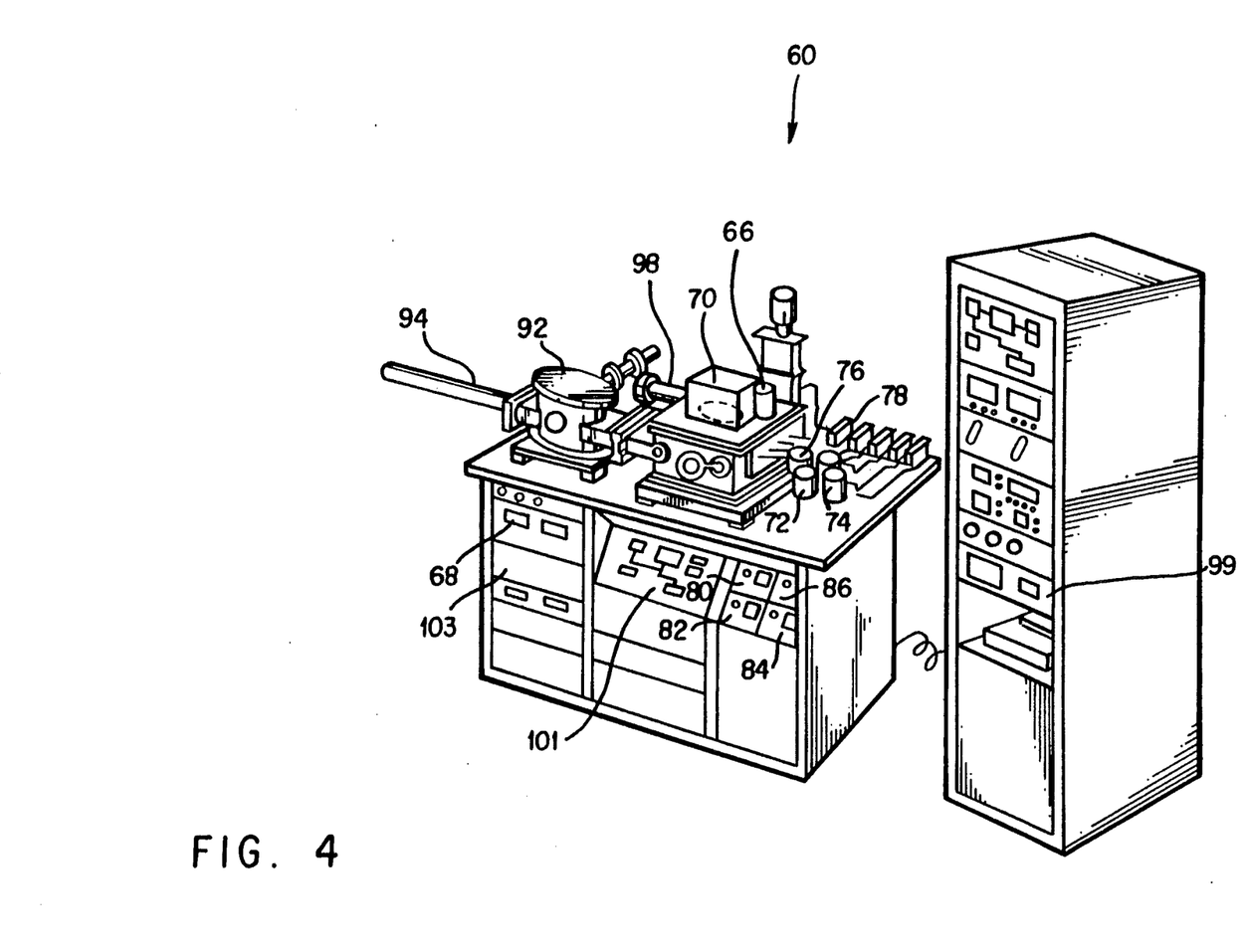
FIG. 4 is a perspective view of the second embodiment.

FIGS. 3 and 4 show a second embodiment which is a photo/plasma-enhanced rapid thermally pulsed metallorganic CVD from stabilized compound sources. The photo-enhancement comes from a UV source as well as from RF decomposition because of the collision of particles.

The second embodiment uses some of the elements described and shown in FIG. 1. To minimize description of the second embodiment, the description of such FIG. 1 elements will not be repeated, and descriptive labels have been included in FIGS. 3 and 4. The abundance of descriptive labels and structure shown in FIGS. 3 and 4, in combination with the above description of FIG. 1, makes the second embodiment clear to the artisan with little or no further description.

The apparatus 60 shown in FIGS. 3 and 4 includes a deposition or main process chamber 62 and electrical means 64, 66, 68 for applying an RF bias and a DC bias in the chamber 62. FIG. 3 shows the RF-DC input 64 and FIG. 4 shows the RF feed thru 66 and RF power supply 68.

There is included a rapid thermal processor 70 having an internal radial heat source for rapid thermal processing, and a plurality of sol-gel atomizer sources 72, 74, 76, 78 with independent sol-gel control panels 80, 82, 84, 86.

Chamber 62 is provided with a demountable rectangular flange 87 through which the plurality of separate vaporized sol-gel sources are introduced. Chamber 62 has a self-contained rapid thermal heating panel, RF-DC electrodes, and a thermally-controlled heated platen.

A 0-100 capacitance manometer monitors the pressure in chamber 62, and its signal controls the downstream throttle valve to maintain precise pressures in chamber 62. A hinged top cover is "0" ring-sealed to provide rapid access to chamber 62 for modification to existing fixtures. The RF-DC electrode 88 penetrates through the top cover and has appropriate shields and filter networks.

Processor 70 includes a high-watt density planar surface 89 opposite the heated platen 90. A quartz window protects the planar surface 89 from depositions. Spare ports for viewing and access for other source materials are provided.

Access from a load lock chamber 92 to chamber 62 is provided through an air-operated slit valve 93. A linear transporter 94 enables the movement of substrate from a vacuum load lock to chamber 62.

Chamber 92 is rough pumped, and then high vacuum pumped through a turbomolecular pump 95 with appropriate valves. High vacuum pump-down of chamber 62 is accomplished with turbomolecular pump 95 backed by a mechanical pump 96.

An RGA (residual gas analyzer) system including an RGA 97, and RGA head 98, an RGA power supply 99, and an RGA spectra printer 100 is provided. The RGA system is provided for analyzing the cracking patterns within chamber 62 and for analyzing the decomposition products of chamber 62 from 1 atmosphere to extremely low pressures. Mass resolution of up to 200 AMU is provided. Printer 100 replicates the spectra displayed on the CRT screen. The system valves and controls are interlocked to provide for safe and proper operation of the system. A schematic valve control 101 is provided to operate the system and system elements with lighted indicators to show their status.

The planar radiant panel 89 has a low mass, fast response time element which is capable of being pulsed by the appropriate control circuitry. The sol-gel sources are provided with means to control the temperature control and dispersion rates of the source materials into chamber 62. A separate mass flow channel 102 is used to introduce oxygen and/or any other inert or process-active gases into chamber 62.

Chambers 92 and 62 are capable of being high vacuum pumped by means of pump 95. The RF-DC plasma system is supplied with a matching network 103. The exhaust system includes a mechanical pump 104, a cold trap 105 with purge features, and throttle valve with controls. The effluents are directed to a burn box and scrubber combination 106 to assure safe disposal of toxic, corrosive and flammable vapors, if any.

Another aspect of the invention is that the sol-gel compound source is agitated ultrasonically to atomize the compound before it is introduced into the process chamber. Depending upon the particular compound source and application, it may be desirable to heat the lines through which the vapor is introduced into the process chamber.

Another aspect of the invention is that a single precursor or solvent is used to predetermine how the vaporized compound source will crack inside the processing chamber. With a single precursor or solvent, the system can be turned to that precursor to manage the process precisely.

Another aspect of the invention involves a solvent exchange technique. Many times a compound X will dissolve in one particular solvent only and no other solvent. Similarly, a compound Y may dissolve in a different solvent and the solvent for compound X is not compatible with the solvent for compound Y. With the present invention, a solvent exchange technique arrives at a common solvent in order to produce the sol-gel having compounds X and Y. That common solvent is the specially designed single precursor to which the system may be tuned. Furthermore, the present invention utilizes tailoring a common solvent for the correct vapor pressure.

With the sol-gel techniques used by the present invention, different sources can be used to change the conductivity and type of material for each deposited layer. The present invention thus permits the engineering of the deposited material layer by layer, and determining in advance the conductivity and type of each layer deposited.

With the engineering and tailoring features of the invention, devices can be produced having graded electrodes. To do so the graded electrode is produced by changing the composition and conductivity layer by layer to produce a tailored graded contact area and/or the contact itself which is very desirable for ferroelectric devices.

Another aspect of the invention involves subjecting PZT or any of the perovskites, to UV plus hydrogen to make it conductive. The inventive concept resides in reducing the perovskite and/or to dope it to make it n-type for the surface to control the metal to ferroelectric barrier, and thus push the p-n junction away from the surface (assuming the perovskite is p-type, and vice-versa if the material is n-type). The junction is pushed in so that the depletion region is pushed into the material, rather than leaving it on the surface where it is undesirable. This can be accomplished with the CVD techniques of the invention by tailoring the layers being deposited.

The invention (both embodiments) is suited for the deposition of high quality thin films of compounds such as ferroelectrics, super-conductors, materials with high dielectric constants, gems, etc. For example, the invention can be used to deposit thin films of ferroelectric materials having a general composition of $ABO_3$, including $PbTiO_3$, $Pb_xZr_yTiO_3$, $Pb_xLa_yZr_zTiO_3$, and $YMnO_3$ where Y represents any rare-earth element.

According to one aspect, each vaporized source introduced into chamber 2 from manifold 14 is stabilized such that no, or substantially no, chemical reactions which destabilize the compound source of its predetermined molecular formation occur within chamber 2. Rather, the stabilized vaporized source is then heated and/or subjected to RF and/or UV illumination so that a desired component or components will be dissociated, decoupled or cracked from the vaporized source and subsequently deposited on substrate 6.

Thin films of ferroelectric materials may be generated from an appropriate, stabilized sol-gel or MOD formulation vaporized using unit 16. An MOD formulation is similar to a sol-gel formulation in that it includes a dispersion of a micropowder of the desired substance into a solution including xylene as the organic base, whereas sol-gel formulations use solutions including alcohols as the organic base. Once the vaporized source is introduced into chamber 2, spectral energy and/or heat is applied to the vaporized source in a novel manner to dissociate or crack the desired component(s) from the organic base to deposit the component(s) on substrate 6.

Research by the present inventors in the synthesis of ferroelectric $ABO_3$ perovskites in organic solutions reveals that stabilized sources of these materials can be designed and generated with relative ease in liquid form, including sol-gel and MOD formulations. These stabilized liquid sources may be utilized to produce a large variety of new, complex (compound), stoichiometrically correct thin films.

Use of stabilized sources is a preferred aspect of the invention. Such sources are relatively easy to generate, even for complex compounds. Such stabilized sources are substantially less toxic and easier to handle than corresponding reactants, whereby the stabilized sources can be handled and processed at a substantially lower cost than the corresponding reactants. Beause no, or substantially no, chemical reactions which destabilize the vaporized source occur in chamber 2, the chamber 2 is designed, constructed and maintained at a reduced cost in comparison to conventional chambers. Because it is easier to control a dissociation or a chemical decomposition than a chemical reaction, it is easier to generate a high quality, stoichiometrically-correct thin film using stabilized sources rather than corresponding reactants.

The term "stabilized source" as used herein is intended to mean a source which is obtained by mixing precursors for each element using sol-gel techniques (or other mixing techniques) which lead to a common solvent, and then using the solution having that common solvent as the sole source for the entire compound. Other sources may also be used in parallel for doping or modifying the compound. In the sol-gel the elements are already in the compound in solution with the common solvent or metallorganic precursor.

An example of the sol-gel synthesis of $YMnO_3$ follows. 1 gm. of yttrium isopropoxide $Y[OCH(CH_3)_2]_3$ was mixed with 8 ml. of 2-methoxyethanol. The yttrium isopropoxide did not go into solution, but was forced into solution by the addition of approximately 25 drops (slightly over one ml.) of hydrochloric acid.

0.25 grams of manganese acetate $Mn(OOCCH_3)_2H_2O$ was mixed with 5 ml. 2-methoxyethanol. The manganese acetate would not dissolve in the 2-methoxyethanol, but was forced into solution by the addition of approximately 10 drops of hydrochloric acid.

The yttrium and manganese solutions were then mixed together at room temperature resulting in a slightly yellow colored solution. The resulting $YMnO_3$ solution did not form a film when spun onto a silicon wafer. Adding $H_2O$ for hydrolysis did not improve the film-forming characteristics. However, the addition of approximately 25 drops of titanium isopropoxide (a gel former) to the yttrium/manganese solution resulted in a solution which remained clear for approximately 3 hours and formed good films when spun onto a silicon wafer.

The invention includes the feature of generating a stabilized source by bubbling a carrier gas through a stabilized liquid source and/or atomizing the liquid source via an ultrasound cavity with the gas passing through. The liquid source is introduced into an ultrasonic cavity. The carrier gas passes through the cavity and by ultrasonic vibration mixes with the liquid. The resulting heavily saturated (atomized) gas-liquid mixture is introduced into the deposition chamber by way of a suitable nozzle. Injection of the gas-liquid mixture into the vacuum in the deposition chamber is controlled by such nozzle.

If the FIG. 2 flow chart is used with respect to the second embodiment, stage 104 should include parameters RF bias/pre-clean and DC bias, and stage 108 should include the RF-DC biases.

The RF cleans the deposition surface, and cracks the vaporized compound source because the RF is tuned to the correct frequency and energy, and is also a UV generator.

The DC process keeps the RF from damaging the as-deposited surface; achieves poling in-situ of the ferroelectric film adding to the film quality (dipole ordering along the c-axis); and the resulting ordering reduces dislocation density which is usually responsible for fatigue and retention problems.

The invention allows very thin layers (below 200 Å) to be deposited. Such layers need to be formed somewhere in the film (surface or middle) using dopants, stoichiometric modifications, and/or a completely different material. If these layers are formed in the middle, they function as gettering layers or floating gates. If the layers are formed on or in the surface, they function as graded surfaces or graded electrodes. Surfaces that are not graded lead to fatigue because of space charges between the electrode and the ferroelectric or a surface layer that is uncontrollable and highly damaged (high in dislocation density).

A controlled surface is a key benefit of this invention. A thin surface layer may be created prior to electroding, and such layer may be p-type doped or n-type doped. A controlled surface means that the surface region can be tailored to have a varying composition to achieve different conductivity and dielectric constant, and pushing the depletion regions caused by self-inverted or self-depleted skin layers of wide band ferroelectric oxides. The present invention allows tailoring of layers by either doping, and/or UV-enhanced reduction in a reducing atmosphere such as hydrogen.

Using n-type or p-type layers in conjunction with breaking the top and/or bottom electrode of a capacitor into gates independently biased allows for the creation of a whole new series of devices which are critically dependent on the present invention for their fabrication. The general class of such devices may be referred to as ferroelectric gated trans capacitors. Such devices may be classified as split-gate, fringe-gate, or a combination of split- and/or fringe-gate.

The invention is advantageous in depositing complex, compound thin films of materials such as ferroelectrics, super-conductors, materials with high dielectric constants, gems, etc., but it not limited to depositing such complex thin films.

Although there has been described preferred embodiments of the invention, the invention can be embodied in other specific forms without departing from the spirit or essential characteristics thereof. The described embodiments are to be considered in all aspects as illustrative and not restrictive. The scope of the invention is indicated by the appended claims rather than the foregoing description.

We claim:

1. A method of depositing a thin film of a chemical compound on a substrate, comprising the steps of:

providing a substrate in an enclosed deposition chamber;

introducing at least one vaporized compound source into said chamber at a controlled flow rate;

applying a spectral energy bath to said source within said chamber in a controlled manner to dissociate at least one chemical compound from said source and to permit said chemical compound to be deposited on said structure;

tuning said bath to provide an optimum energy for dissociating said chemical compound;

said source being stabilized such that substantially no chemical reactions which destabilize said compound of its predetermined molecular formulation occur within said chamber; and said stabilized vaporized source is generated by atomizing a stabilized liquid source via an ultrasound cavity with a carrier gas passing through.

2. A method according to claim 1, including:

heating the enclosed space within said chamber to an elevated temperature that is insufficient to dissociate said component from said source; and said elevated temperature and said bath being controlled in combination to optimize the dissociation of said component from said source.

3. A method according to claim 2, including:

applying heating pulses to said chamber to rapidly thermally stress said source and the material being deposited;

said steps of applying said bath, heating the enclosed space within said chamber, and applying pulses are effected using different means.

4. A method according to claim 3 wherein said different means are controlled in combination such that the temperature within said chamber changes in a stepped manner over the course of deposition, and the temperature steps are precisely controlled such that said component is dynamically activated as it is being deposited.

5. A method according to claim 4, including:

controlling said chamber to have at least one predetermined vacuum level throughout the course of deposition;

providing sensors for monitoring said flow rate, the temperature and pressure in said chamber, and the thickness of film deposited; and providing a computer control unit which receives signals from said sensors and which effects the method in a predetermined manner.

6. A method according to claim 4, including:

annealing a thin film of said component as deposited on said substrate in-situ within said chamber by applying additional high energy heating pushes to said film for a predetermined time period.

7. A method according to claim 1, including:

controlling said chamber to be under a vacuum condition; and prior to introducing said compound source, preparing said vaporized compound source by ultrasonically treating a sol-gel of the compound source in a predetermined stoichiometric ratio so that said film deposited on said substrate is stoichiometrically-correct.

8. A method according to claim 1, including:
controlling said chamber to be under a vacuum condition;
prior to introducing said vaporized compound source into said chamber, preparing said vaporized compound source from a sol-gel or MOD formulation having a general composition of $ABO_3$, including $PbTiO_3$, $Pb_zZr_xTiO_3$, $Pb_xLa_yZr_zTiO_3$, $YMnO_3$ where Y represents any rare-earth element, and $TiYMnO_3$, in a predetermined stoichiometric ratio so that said film deposited is stoichiometrically-correct.

9. A method according to claim 1, including:
depositing said component to form a very thin-layer below 200 Å.

10. A method according to claim 1, including:
tailoring one or more layers of said thin film by either doping and/or UV-enhanced reduction in a reducing atmosphere.

11. A method according to claim 10, including:
using n-type or p-type layers in conjunction with breaking the top or bottom electrode of a capacitor into gates which are independently biased to form a ferroelectric gated transcapacitor device.

12. A device produced by the method of claim 11, including:
one or more split gates, one or more fringe gates, and/or one or more combination split and fringe gates.

13. A product produced by the method of claim 1, including:
one or more very thin layers of said deposited component having a thickness below 200 Å;
said layer being formed using dopants, stoichiometric modifications, and/or completely different materials;
one or more of said layers being formed in the interior of said product and functioning as a gettering layer or floating gate; and
one or more of said layers being formed in the surface of said product and functioning as a graded surface or graded electrode.

14. A product produced by the method of claim 1, wherein:
said product has a thickness in the range 100–5000 Å; and
said deposited component may be a ceramic, a glasseous material, an electrically-active material, and/or a ferroelectric material.

15. A method according to claim 1, comprising further steps of:
applying a radio frequency bias in said chamber; and
applying a direct current bias in said chamber.

16. An apparatus for depositing a thin film on a substrate, comprising:
a deposition chamber having an enclosed space therein:
means for introducing at least one vaporized compound source into said chamber at a controlled flow rate;
first means for applying a spectral energy bath to said chamber as said source is introduced therein; and
control means for controlling said flow rate and said first means such that said bath provided thereby is optimally tuned to dissociate at least one chemical compound from said source and to deposit said chemical compound on a substrate within said chamber;
said introducing means includes means for generating a stabilized vaporized source by atomizing a stabilized liquid source via an ultra sound cavity with a carrier gas passing through, and means for introducing said stabilized vaporized compound source into said chamber so that substantially no chemical reactions which destabilize said compound of its predetermined molecular formulation will occur within said chamber.

17. Apparatus according to claim 16, including:
second means for heating the space within said chamber to an elevated temperature; and
said control means controlling said second means such that the heat provided thereby is insufficient to dissociate said component from said source, and controlling said first and second means in combination such that the heat provided thereby optimizes dissociation of said component from said source.

18. Apparatus according to claim 17, wherein:
said first means includes a UV source; and
said second means includes a heater which may or may not be pulsed.

19. An apparatus according to claim 17, including:
third means for applying high energy heating pulses to said chamber to rapidly thermally stress said source as introduced into said chamber and said component being deposited.

20. Apparatus according to claim 19, wherein said control means controls said third means such that said pulses are applied in a stepped, timed sequence based on said flow rate, on a desired thickness of the film being deposited, and on a predetermined activation energy of said component being deposited.

21. Apparatus according to claim 16, including:
means for controlling said chamber to be under a vacuum condition; and
means for preparing said vaporized compound source, prior to its introduction into said chamber, by ultrasonically treating a sol-gel of the compound source in a predetermined stoichiometric ratio so that said film deposited is stoichiometrically-correct.

22. Apparatus according to claim 16, including:
means for controlling said chamber to be under a vacuum condition;
means for preparing said vaporized compound source, prior to its introduction into said chamber, by stabilizing a sol-gel or MOD formulation having a general composition of $ABO_3$, including $PbTiO_3$, $Pb_xZr_xTiO_3$, $Pb_xLa_yZr_zTiO_3$, $YMnO_3$ were Y represents any rare-earth element, and $TiYMnO_3$, in a predetermined stoichiometric ratio so that said film deposited is stoichiometrically-correct.

23. Apparatus according to claim 16, further including:
electrical means for applying a radio frequency bias and a direct current bias in said chamber.

* * * * *

UNITED STATES PATENT AND TRADEMARK OFFICE
CERTIFICATE OF CORRECTION

PATENT NO. : 5,138,520
DATED : August 11, 1992
INVENTOR(S) : Larry D. McMillan and Carlos A. Paz de Araujo It is certified that error appears in the above-identified patent and that said Letters Patent is hereby corrected as shown below:

Column 1, line 62, change "$Pb_xLa_yZr_sTiO_3$" to -- $Pb_xLa_yZr_zTiO_3$ --
Column 2, line 26, change "passes" to -- passed --;
        line 27, delete the comma.
Column 3, line 17, change "of" to -- or --;
        line 24, change "nanmometers" to -- nanometers --;
        line 26, change "hold" to -- holding --;
        line 39, change "substrate" to -- substrates --;
        line 51, change "of" to -- or --; change "underling" to -- underlying --.
Column 4, line 20, change "maybe" to -- may be --.
Column 6, line 1, change "feed thru" to -- feedthru --.
Column 7, line 8, change "turned" to -- tuned --.
Column 8, line 27, change "Beause" to -- Because --.
Column 9, line 62, change "it" to -- is --.
Column 10, line 15 (claim 1, line 11), change "structure" to -- substrate --;
        line 39 (claim 4, line 1) after "3" insert a comma;
        line 58 (claim 6, line 4), change "pushes" to -- pulses --.
Column 11, line 8 (claim 8, line 8), change "$Pb_zZr_xTiO_3$" to -- $Pb_xZr_yTiO_3$ --;
        line 35 (claim 13, line 5), change "layer" to -- layers --.

UNITED STATES PATENT AND TRADEMARK OFFICE
CERTIFICATE OF CORRECTION

PATENT NO. : 5,138,520
DATED : August 11, 1992
INVENTOR(S) : Larry D. McMillan and Carlos A. Paz de Araujo It is certified that error appears in the above-indentified patent and that said Letters Patent is hereby corrected as shown below:

Column 12, line 56 (claim 22, line 8), change "$Pb_xZr_xTiO_3$" to $Pb_xZr_yTiO_3$ --.

Signed and Sealed this

Thirty-first Day of August, 1993

BRUCE LEHMAN

*Attest:*

*Attesting Officer*    Commissioner of Patents and Trademarks